(12) United States Patent
Akatsu et al.

(10) Patent No.: US 7,001,826 B2
(45) Date of Patent: Feb. 21, 2006

(54) WAFER WITH A RELAXED USEFUL LAYER AND METHOD OF FORMING THE WAFER

(75) Inventors: Takeshi Akatsu, St Nazaire les Eymes (FR); Bruno Ghyselen, Seyssinet (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/663,917

(22) Filed: Sep. 17, 2003

(65) Prior Publication Data

US 2004/0067622 A1 Apr. 8, 2004

Related U.S. Application Data

(60) Provisional application No. 60/439,428, filed on Jan. 13, 2003.

(30) Foreign Application Priority Data

Sep. 18, 2002 (FR) .................................. 02 11543

(51) Int. Cl.
*H01L 21/30* (2006.01)
*H01L 21/46* (2006.01)

(52) U.S. Cl. .................. 438/458; 438/459; 438/481; 438/933

(58) Field of Classification Search ................ 438/413, 438/455, 458, 459, 481, 518, 933
See application file for complete search history.

(56) References Cited

U.S. PATENT DOCUMENTS

| | | | |
|---|---|---|---|
| 5,461,243 A | 10/1995 | Ek et al. | 257/190 |
| 6,064,081 A | 5/2000 | Robinson et al. | 257/183 |
| 6,100,166 A | 8/2000 | Sakaguchi et al. | 438/455 |
| 6,323,108 B1 * | 11/2001 | Kub et al. | 438/458 |
| 6,521,041 B1 | 2/2003 | Wu et al. | 117/94 |
| 6,534,382 B1 | 3/2003 | Sakaguchi et al. | 438/455 |
| 6,593,641 B1 | 7/2003 | Fitzgerald | 257/616 |

(Continued)

FOREIGN PATENT DOCUMENTS

| | | |
|---|---|---|
| EP | 0 849 788 A | 6/1998 |
| WO | WO 99/53539 A | 10/1999 |
| WO | WO 02/071495 A | 12/2002 |

OTHER PUBLICATIONS

Cheng, Z-Y et al., "SiGe-On-Insulator (SGOI): Substrate Preparation and MOSFET Fabrication for Electron Mobility Evaluation," IEEE International SOI Conference, pp. 13-14, Oct. 2001.

(Continued)

*Primary Examiner*—Amir Zarabian
*Assistant Examiner*—Pamela E Perkins
(74) *Attorney, Agent, or Firm*—Winston & Strawn LLP

(57) ABSTRACT

A process for forming a useful layer (6) from a wafer (10), the wafer (10) comprising a supporting substrate (1) and a strained layer (2) that are chosen respectively from crystalline materials. The process includes a first step of forming a region of perturbation (3) in the supporting substrate (1) at a defined depth by creating structural perturbations that cause at least relative relaxation of the elastic strains in the strained layer (2). A second step of supplying energy causes at least relative relaxation of the elastic strains in the strained layer (2). A portion of the wafer (10) is removed from the opposite side from the relaxed strained layer (2'), the useful layer (6) being the remaining portion of the wafer (10). The present invention also relates to an application of the process and to wafers produced during the process.

15 Claims, 3 Drawing Sheets

U.S. PATENT DOCUMENTS

| | | | |
|---|---|---|---|
| 6,646,322 B1 | 11/2003 | Fitzgerald | 257/531 |
| 6,677,192 B1 | 1/2004 | Fitzgerald | 438/172 |
| 6,756,286 B1 | 6/2004 | Moriceau et al. | 438/459 |
| 6,780,796 B1 * | 8/2004 | Maa et al. | 438/795 |
| 6,787,793 B1 * | 9/2004 | Yoshida | 257/19 |
| 6,852,652 B1 * | 2/2005 | Maa et al. | 438/197 |
| 2001/0003269 A1 | 6/2001 | Wu et al. | 117/94 |
| 2002/0072130 A1 | 6/2002 | Cheng et al. | 438/10 |
| 2002/0123183 A1 | 9/2002 | Fitzgerald | 438/199 |
| 2002/0125497 A1 | 9/2002 | Fitzgerald | 257/191 |
| 2002/0185686 A1 | 12/2002 | Christiansen et al. | 257/347 |
| 2003/0077867 A1 | 4/2003 | Fitzgerald | 438/285 |
| 2003/0203547 A1 | 10/2003 | Sakaguchi et al. | 438/151 |
| 2004/0000268 A1 | 1/2004 | Wu et al. | 11/94 |

OTHER PUBLICATIONS

Tong, Q.Y. et al., "Semiconductor Wafer Bonding" (extracts), Science and Technology, Interscience Technology, Nov. 1998.

H. Trinkaus, *Strain relaxation mechanism for hydrogen-implanted $Si_{1-x}Ge_x$ /Si(100) heterostructures*, Jun. 12, 2000, pp. 3552-3554.

B. Holländer, *Strain relaxation of pseudomorphic $Si_{1-x}Ge_x$/ Si(100) heterostructures after hydrogen or helium ion implantation for virtual substrate fabrication*, pp. 357-367.

B. Holländer, *Substrate Engineering by Hydrogen or Helium Implantation for Epitaxial Growth of Lattice Mismatched $Si_{1-x}Ge_x$ Films on Silicon*, 2000, pp. 326-329.

* cited by examiner

WAFER WITH A RELAXED USEFUL LAYER AND METHOD OF FORMING THE WAFER

CROSS-REFERENCE TO RELATED APPLICATIONS

This application claims the benefit of U.S. Provisional Application No. 60/439,428 filed Jan. 13, 2003, the content of which is expressly incorporated herein by reference thereto.

FIELD OF THE INVENTION

The present invention relates to the formation of a useful layer in a wafer, and more particularly to forming a wafer comprising a substrate and a strained layer chosen respectively from crystalline materials for an application in microelectronics, in optics or in optoelectronics with the strained layer subsequently being at least partially released.

BACKGROUND OF THE INVENTION

It is sometimes useful or advantageous to form, in a same wafer, a layer of a first crystalline material on a substrate of a second crystalline material that has a different nominal lattice parameters respectively, but while keeping the crystal structure of the second material relaxed or mostly relaxed and/or without an excessive number of crystallographic defects. For this purpose, it is known to insert a buffer layer between the substrate and the formed layer.

In this configuration, a "buffer layer" is understood to mean a transition layer that matches the lattice parameter of the formed layer with that of the substrate. For this purpose, such a buffer layer may have a composition that gradually varies through the thickness, the gradual variation of components of the buffer layer being directly associated with a gradual variation in its lattice parameter between the respective lattice parameters of the substrate and of the formed layer. The buffer layer may also have a more complex form, such as a variable-content compositional variation, an inversion in the sign of the content, or discontinuous step changes in composition.

The formation of such a variable composition generally takes a long time and is often complex to implement. Moreover, to minimize the density of crystallographic defects in the buffer layer, the thickness of a buffer layer is usually large, typically between one and several microns. The production of such a buffer layer therefore involves often lengthy, difficult and expensive processing.

A technique of relaxing elastic strains in a formed layer giving a similar result with substantially less processing required is taught by B. Höllander et al. in the document entitled "Strain relaxation of pseudomorphic $Si_{1-x}Ge_x/Si$ (100) heterostructures after hydrogen or helium ion implantation for virtual substrate fabrication" (in Nuclear and Instruments and Methods in Physics Research B 175–177 (2001) 357–367). The process described relates to the relaxation of a strained SiGe layer in compression, with this layer being formed on an Si substrate.

The technique employed comprises the implantation of hydrogen or helium ions through the surface of the strained layer into the Si substrate to a defined depth. A crystalline perturbation created by the ion implantation and located in a thickness of the Si substrate lying between the implantation region and the SiGe layer causes, under a heat treatment, a certain relaxation of the SiGe layer.

A process is needed to readily relax the strain on a layer with efficiency of material and to transfer this layer to another substrate.

SUMMARY OF THE INVENTION

The present invention relates to method of preparing crystalline wafer. A preferred embodiment includes providing a first composite structure comprising a support substrate and a first epitaxial layer that is in a strained state and is associated with one side of the support substrate. The strained state of the first epitaxial layer of the composite structure is relaxed to an at least partially relaxed state. A receiving substrate is associated, such as by bonding, with the first composite structure with the side of the support that includes the first epitaxial layer. A production wafer and a donor wafer are obtained by splitting the first composite structure at a region of weakness located therein.

Preferably, the strained state of the first epitaxial layer is relaxed by providing dislocations in a dislocation layer within the first composite structure in a configuration sufficient to relax the first epitaxial layer to a substantially relaxed state. This is preferably done prior to associating the receiving substrate with the structure by bonding to the relaxed first epitaxial layer.

The region of weakness preferably is created by implanting atomic species at a second implantation location that is spaced from the first implantation location and is disposed in the support substrate. The region of weakness can be disposed in the first epitaxial layer or in the support substrate, preferably on the side of the first epitaxial layer from a region of perturbations if one is made to relax the first epitaxial layer.

In one embodiment, an additional layer is provided on the relaxed first epitaxial layer prior to associating the receiving substrate with the first composite structure, preferably with the receiving substrate being bonded to the additional layer. The crystalline wafer can be a semiconductor wafer, and the additional layer can be a strained silicon layer. An additional layer can alternatively or additionally be provided between the first epitaxial layer and the support substrate, preferably prior to associating the receiving substrate with the first composite structure, and preferably with the receiving substrate is bonded to the relaxed first epitaxial layer.

A layer of the production wafer disposed on an opposite side of the first epitaxial layer from the receiving substrate can be removed to provide an exposed surface, and another layer can be provided on the exposed surface of the production wafer. This other layer is preferably grown on the exposed surface.

One embodiment of the support substrate comprises silicon. In this embodiment, first epitaxial layer comprises silicon germanium. Preferably, the epitaxial layer is relaxed sufficiently to reduce the strain to less than 50% of the strain than in the strained state.

In a preferred embodiment, the strained state of the first epitaxial layer is relaxed by providing dislocations in a dislocation layer within the first composite structure in a configuration sufficient to relax the first epitaxial layer to a substantially relaxed state. The dislocations can be provided by implanting atomic species in the first composite structure in a dosage sufficient to relax the first epitaxial layer to the relaxed state, and in one embodiment, the atomic species are also implanted to produce the region of weakness. In another embodiment, the region of weakness is created spaced from the first implantation location. To relax the first epitaxial layer, energy, such as thermal energy, may be added to the first composite structure to relax the first epitaxial layer. Additionally, the dislocation layer can be disposed in the support substrate or in the strained layer.

A preferred crystalline wafer according to the invention includes a first composite structure comprising a support substrate having associated on one side thereof a first epitaxial layer. The support substrate is made of a material that does not allow the first epitaxial layer to be epitaxially associated therewith in a relaxed state. A receiving substrate is associated with the support substrate adjacent the side that includes the first epitaxial layer. A dislocation layer is located within the first composite structure in a configuration and location sufficient to impart a relaxed state to the first epitaxial layer that is substantially more relaxed than in a stressed state in which the first epitaxial layer can be grown on the support substrate.

In one embodiment, the configuration and location of the dislocation layer being insufficient to facilitate proper splitting of the first composite substrate. Preferably, the first epitaxial layer in the relaxation state has less than about 75% of the strain than in the strained state in which the epitaxial layer can be grown on said material of the support structure, more preferably les that about 50% and most preferably less than about 25%.

The dislocation layer may contain atomic species implanted at a first implantation location in the structure, and a region of weakness may be provided to facilitate splitting of the structure. The region of weakness may include atomic species implanted at a second implantation location that is spaced from the first implantation location. Also, the wafer may include an additional layer connected to the first epitaxial layer.

The present invention provides a method an a structure in which a strained layer is relaxed, preferably without the use of a graded buffer layer, and employs the produced wafer in a splitting operation to transfer the strained layer to another substrate.

BRIEF DESCRIPTION OF THE DRAWINGS

Further features and advantages of the present invention will become more clearly apparent on reading the detailed description with reference to the following figures.

DETAILED DESCRIPTION OF THE PREFERRED EMBODIMENTS

In this text, a layer is said to be "relaxed" if the crystalline material of which it is composed has a lattice parameter substantially identical to its nominal lattice parameter, that is to say the lattice parameter of the material in its bulk form in equilibrium. Conversely, a "strained" layer refers to any layer of a crystalline material whose crystal structure is elastically strained in tension or in compression during crystal growth, such as epitaxial growth, requiring its lattice parameter to be substantially different from the nominal lattice parameter of this material.

It is of interest to use this technique to subsequently integrate this relaxed or pseudo-relaxed layer into a structure for the fabrication of components, especially for electronics or optoelectronics. The present invention allows this layer integration by providing a process for forming a useful layer from a wafer. The wafer comprises a supporting substrate and a strained layer chosen respectively from crystalline materials for an application, such as in microelectronics, optics, or optoelectronics. The preferred process includes the following steps:

(a) formation in the supporting substrate of a region of perturbation at a defined depth capable of forming structural perturbations;

(b) supply of energy to cause at least partial relaxation of the elastic strains in the strained layer; and (c) removal of a portion of the wafer on the opposite side to the relaxed strained layer, the useful layer being the remaining portion of the wafer.

A recycling process and a removal process are also possible with the present invention. Source wafers that donate a thin layer by transfer are also contemplated.

An embodiment of the present invention involves:

(a) a source wafer in which a useful layer includes:
a supporting substrate, and
a strained layer on the supporting substrate; and
(b) a receiving substrate that forms a support for of the useful layer.

In this text, and in general, a "useful layer" is typically a portion of the source wafer that is on the receiving substrate, such as exposed therefrom. The present invention includes providing a relaxed or semi-relaxed useful layer on the receiving substrate from the source wafer. The strained layer had been relaxed or pseudo-relaxed beforehand without a buffer layer.

Figure 1A:
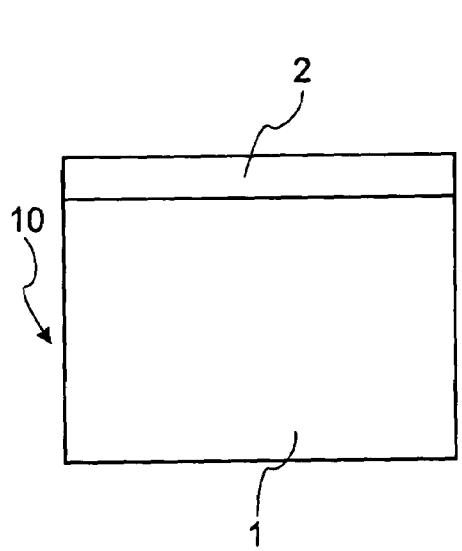
FIGS. 1a–1d show various steps of an embodiment of a process conducted according to the present invention.

Referring to FIG. 1a, a first composite structure, such as a source or donor wafer 10, includes a supporting substrate 1 and a strained layer 2 associated therewith. The supporting substrate can has multiplep layers, for example, comprising an upper layer made of a crystalline material, such as a semiconductor material that has an interface with the strained layer 2 and having a first lattice parameter at this interface. The first lattice parameter of the upper layer is advantageously the nominal lattice parameter of the material of which it is composed, so that its material is in a relaxed state. The upper layer furthermore has sufficient thickness to impose its lattice parameter on the overlying strained layer 2 without the latter having a substantial influence on the crystal structure of the upper layer of the supporting substrate 1.

Another embodiment of the supporting substrate 1 has only crystalline material with the first lattice parameter. The supporting substrate 1 can be a single-crystal substrate. Whatever the configuration chosen for the supporting substrate 1, this substrate 1 preferably has a crystal structure with a low density of structural defects, such as dislocations, and a significantly lower density than in a traditional substrate with a buffer layer.

On embodiment of the strained layer 2 is single thickness of a crystalline material such as a semiconductor material. The material chosen to form this strained layer 2 has a second nominal lattice parameter that is substantially different from the first lattice parameter. The strained layer 2 formed is then elastically strained in compression or in tension by the supporting substrate 1, that is to say it is forced to have a lattice parameter substantially different from the nominal lattice parameter of the material of which it is composed and therefore to have a lattice parameter close to the first lattice parameter.

In a preferred embodiment, the material of strained layer 2 has a second nominal lattice parameter that is substantially greater than the first lattice parameter, and is therefore strained in compression. Preferably, the strained layer 2 has a substantially constant composition of atomic elements throughout its extent.

In another embodiment the strained layer 2 includes several thicknesses of materials, each thickness having a crystalline material such as a semiconductor material. Each thickness of material of the strained layer 2 furthermore preferably has a substantially constant composition of atomic elements. The thickness of material of the strained layer 2 directly adjacent to the interface with the supporting substrate 1 preferably has substantially the same properties as those of a strained layer 2 that would comprise only one material, such as in the above described embodiment.

Providing a small thickness of relaxed material in the strained layer 2 can provide at least one of the following advantages:

(a) it can constitute at least part of the active layer to be provided on the receiving substrate so as to achieve certain material properties;

(b) it can constitute a stop layer during selective removal of material carried out by selective material removal means, such as selective chemical etching performed by an etching solution, so as to preserve an adjacent layer from the material removal;

(c) it has the possibility of substantially greater removal of material, implemented by selective material removal means such as selective etching, than an adjacent layer, the latter then representing a stop layer during selective material removal, thus being protected from the material removal.

A thickness of relaxed material may also combine several of these functions and may have other functions.

The strained layer 2 of the preferred embodiment has a general structure made of strained material and has at least a thickness of material that is strained, as explained above, but may also contain one or more thicknesses of relaxed material which have a cumulative thickness very much less than that of the strained layer 2, so that layer 2 retains an overall strained state. Whatever the chosen configuration for the strained layer 2, it is advantageously formed on the supporting substrate 1 by crystal growth, such as epitaxial growth using the known techniques such as, for example, the CVD (Chemical Vapor Deposition) and MBE (Molecular Beam Epitaxy) techniques.

The strained layer 2 is preferably formed without an excessive number of crystallographic defects, such as point defects or extended defects such as dislocations. It is advantageous to choose the crystalline materials for the composition of the supporting substrate 1 and the strained layer 2 (in the vicinity of its interface with the supporting substrate 1) so that there is a sufficiently small difference between the respective first and second respective nominal lattice parameters to minimize the defects. For example, this lattice parameter difference is typically between about 0.5% and about 1.5%, but it may also have higher values. For example, in IV—IV materials, Ge has a nominal lattice parameter about 4.2% greater than that of Si, and SiGe containing 30% Ge has a nominal lattice parameter about 1.15% greater than that of Si, which reduces or eliminates the defects in a grown Si layer.

Figure 1B:
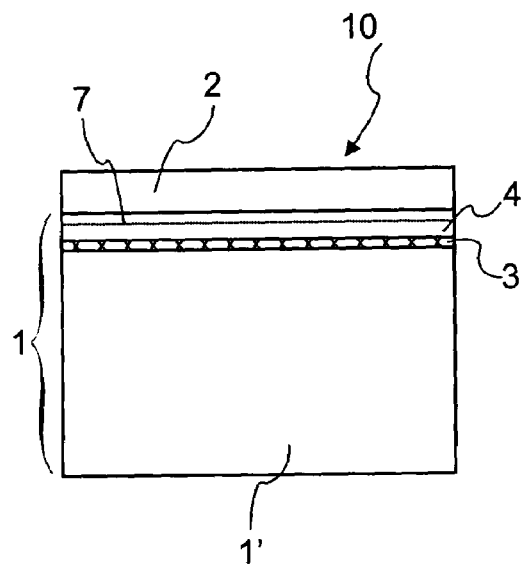
Figure 1C:
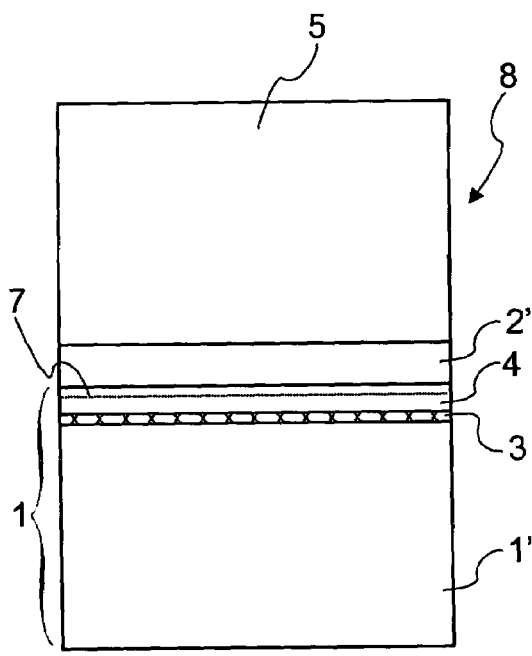

Moreover, it is preferable for the strained layer 2 to have an approximately constant thickness so that it has substantially constant intrinsic properties and can facilitate bonding to the receiving substrate 5 (as shown in FIG. 1c).

To prevent the strained layer 2 from relaxing by the appearance of internal stresses of plastic type appearing, the thickness of said strained layer is kept at less than a critical elastic strain thickness. This critical elastic strain thickness depends principally on the material chosen for the strained layer 2 and on the difference in nominal lattice parameter with the supporting substrate 1. The critical elastic strain thickness for the material used for the strained layer 2 formed on the material used for the supporting substrate 1 can be determined by one of ordinary skill in the art.

Once formed, the strained layer 2 has a lattice parameter substantially similar to that of support substrate 1, on which it was grown, and therefore has internal elastic strain in compression or in tension.

Referring to FIG. 1b, and once the wafer 10 comprising the strained layer 2 has been produced, a region of perturbation 3 is formed in the supporting substrate 1 at a defined depth. A transition layer 4 is bounded between the region of perturbation 3 and the strained layer 2. The region of perturbation 3 is a region that has internal strains capable of forming structural perturbations in the surrounding parts. This region of perturbation 3 is preferably advantageously formed over practically the entire cross-sectional surface of the supporting substrate 1, and preferably is formed generally parallel to the surface of the supporting substrate 1.

One process for forming such a region of weakness 3 comprises the implantation of atomic species in the supporting substrate 1 at the predefined depth, with a defined implantation energy and a defined dose of the atomic species. In one particular method of implementing the implantation, the atomic species implanted comprise hydrogen and/or helium.

Such a region of perturbation 3 formed by implantation therefore has internal strains, or even crystallographic defects, exerted by the implanted atomic species on the crystal lattice adjacent to the region of perturbation 3. These internal strains are capable of creating crystallographic perturbations in the overlying part of the wafer 10.

In one embodiment, a suitable and appropriately parameterized treatment is carried out for:

(a) aiding the appearance of the perturbations in or adjacent to the transition layer 4;

(b) causing the displacement of these perturbations in the transition layer 4 from the region of perturbation 3 towards the interface with the strained layer 2 or allowing the lattice parameter in transition layer 4 to be changed towards the minimal lattic parameter of the strained layer 2; and (c) causing at least partial relaxation of the strained layer 2 after the appearance and the displacement of the perturbations.

This treatment causes at least partial relaxation of the strains in the strained layer 2 so as to form a relaxed layer 2', which as indicated may partially or substantially fully relax, and is at least more relaxed than in the strained state of strained layer 2. An appropriately parameterized heat treatment is preferably carried out to supply sufficient energy to cause these structural modifications. This heat treatment preferably is carried out at a temperature or several temperatures substantially below a critical temperature above which a significant number of implanted atomic species would be degassed.

Local crystallographic perturbations are created from the internal strains in the region of perturbation 3.

In an embodiment, to minimize elastic energy in the strained layer 2, these perturbations appear in the transition layer 4 to be displaced towards the interface between the transition layer 4 and the strained layer 2 along paths defined by particular crystallographic planes. Upon arriving at the interface between the transition layer 4 and the strained layer 2, these perturbations then cause at least partial relaxation of elastic strains in the strained layer 2. In one embodiment, the relaxed strains are mainly lattice mismatch strains between the respective nominal lattice parameters of the material of the strained layer 2 and of the material of the supporting substrate 1.

Such relaxation of elastic strains in the strained layer 2 is mostly accompanied by the appearance of crystalline perturbations in the periphery of the strained layer 2, these possibly being, for example, in the form of dislocations with parameter difference strains at the interface and of atomic steps at the free surface. However, relaxation of the strained layer 2 may also be accompanied by the appearance of inelastic-type crystal defects in the thickness of said layer, such as traversing dislocations.

Suitable treatments may then be carried out in order to reduce the number of these defects. For example, a suitable treatment may be carried out that allows the dislocation density to be increased to between two limiting values that define a dislocation density range in which at least some of the dislocations are eliminated. For this purpose, a heat treatment may be carried out tailored to the material used, such as the heat treatment used to form the perturbations in the abovementioned transition layer 4.

A relaxed or partially relaxed layer 2' whose nominal lattice parameter is substantially different from the nominal lattice parameter of the growth substrate 1 is obtained without an intermediate buffer layer. In some embodiments, however, one or more thicknesses of elastically strained material may be found in the relaxed strained layer 2'. These thicknesses of material would have been included in the strained layer 2 before the elastic relaxation of this layer, with a lattice parameter substantially different from the rest of the strained layer 2. In an embodiment, such thicknesses of material were originally relaxed prior to the provision of the region of perturbation 3, such as where the strained layer 2 is formed with thicknesses of different materials. After the overall relaxation of the strained layer 2, these thicknesses of materials are subjected to elastic strains exerted by the relaxing of the surrounding material, and thus become strained. These thicknesses of material have a cumulative thickness significantly less than that of the overall strained layer 2 so that the layer 2' retains an overall relaxed or mostly-relaxed state after the elastic relaxation step.

Referring to FIG. 1c, a receiving substrate 5 is placed on the surface of the wafer 10 on the side with the relaxed strained layer 2' to form a composite wafer structure 8. The receiving substrate 5 constitutes a mechanical support sufficiently strong to support the useful layer to be formed and to protect it from possible mechanical stresses coming from the outside. This receiving substrate 5 may be made, for example, of silicon or quartz or other types of material. The receiving substrate 5 is preferably attached to the source or donor wafer 10 by bringing it into intimate contact therewith and carrying out a bonding operation, in which there is advantageously wafer bonding (molecular adhesion) between the receiving substrate 5 and the wafer 10. This bonding technique, together with suitable alternatives, is for example described in the document entitled "*Semiconductor Wafer Bonding*" (Science and Technology, Interscience Technology) by Q. Y. Tong and U. Gösele and Wiley.

If necessary, bonding is accompanied by a suitable prior treatment of the respective surfaces to be bonded and/or by supplying thermal energy. Thus, for example, a heat treatment carried out during bonding allows the strength of the bonds to be increased.

The bonding may also be reinforced by a bonding layer provided between the wafer 10 and the receiving substrate 5. This bonding layer is preferably applied to at least one of the two surfaces to be bonded. Silicon oxide (also called silica or $SiO_2$) is a material that may be chosen to produce such a bonding layer, it being possible to produce this material by oxide deposition, thermal oxidation, or other techniques.

Before and/or after bonding, a surface finishing operation may be carried out such as, for example, etching, chemical-mechanical polishing CMP, heat treatment, or other smoothing operation.

Figure 1D:
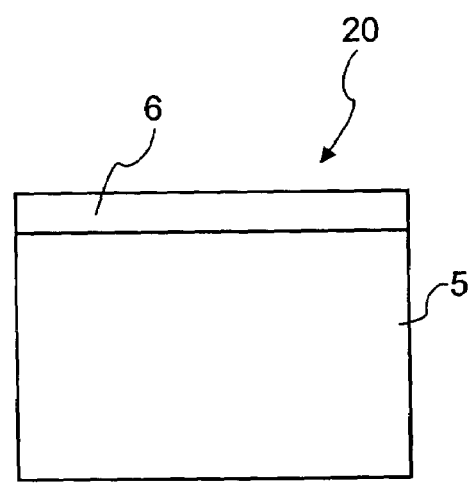

Once the receiving substrate 5 has been bonded, a portion of the source wafer 10 on the opposite side of layer 2' from the receiving substrate 5 is removed. In FIG. 1d, useful layer 6 is the portion of the wafer 10 that remains in association with the receiving substrate 5.

Several known techniques for removing material may be employed. A first material removal technique, known as Smart-Cut® to those skilled in the art (and a description of which may be found in a number of works dealing with wafer reduction techniques) can comprise:

(a) before bonding with the receiving substrate 5, implantation of atomic species (such as hydrogen or helium ions) in order to form a region of weakness 7 at a depth close to or at or around the depth of the implantation;

(b) supply of energy after bonding to the region of weakness, such as a heat and/or mechanical treatment, or another supply of energy, in order to bring about detachment of the wafer 10 in two portions in the region of weakness.

In one embodiment, the wafer 10 is subjected to a heat treatment during or after implantation in order to further weaken the region of weakness.

In a first embodiment of a method for removing the material, the region of weakness 7 is formed between the supporting substrate 1 and the relaxed strained layer 2', or within the layer 2'. In a second embodiment, the region of weakness is formed in the supporting substrate 1. The region of weakness may be formed during or after formation of the perturbation layer 3.

In the second embodiment for the material removal, the region of weakness may be formed substantially at the same location as the region of perturbation 3, by carrying out substantially the same techniques, such as implantation of atomic species with a defined energy and with a defined dose of the species. In this case, the region of weakness could be formed substantially at the same time as the region of perturbation 3 is formed. A region of weakness can be formed that has the double function of weakening the supporting substrate 1 therein and of relaxing the strained layer 2.

Before or after implantation to form the region of weakness, the wafer 10 can be furthermore subjected to a heat treatment having two functions, namely of further weakening the region of weakness 7 and of further relaxing the strained layer 2.

A second material removal technique includes:

(a) formation in the wafer 10 of a region of weakness that comprises a weak interface by forming at least one porous layer by anodization, by implanting atomic species, or by any other pore-forming technique, as described, for example, in document EP 0 849 788 A2; and (b) supply of energy to the region of weakness, such as a mechanical treatment, or another supply of energy, in order to detach the wafer 10 in two portions within the weak layer.

In one embodiment of implementing this material removal, the weak layer or region of weakness is formed between the supporting substrate 1 and the relaxed strained layer 2', or within the layer 2'. In another embodiment of implementing this material removal, the weak layer is formed in the supporting substrate 1.

To form a weak layer within the supporting substrate 1, the porous layer is advantageously formed on a slice of a single-crystal material. Then a second growth of a layer of non-porous crystalline material, having substantially the same lattice parameter as that of the slice, is carried out on the porous layer, and the supporting substrate 1 then consists of the slice, the porous layer and the non-porous Si layer. These material removal techniques allow rapid en bloc removal of a substantial portion of the wafer 10. These techniques also allow the removed portion of the wafer 10 to be reused in another process such as, for example, another transfer process according to the invention. Thus, a strained layer 2 and possibly a portion of the supporting substrate 1 and/or other layers may be reformed, preferably after the surface of the supporting substrate 1 has been polished.

A third known technique consists in using a chemical and/or chemical-mechanical material removal process. For example, optionally selective etching of the materials of the donor wafer 10 to be removed may be carried out using a process of the "etch-back" type. This technique consists in etching the wafer 10 "from the rear" that is to say from the free face of the supporting substrate 1, in order in the end to retain that portion of the wafer 10 which is desired to keep on the receiving substrate 5. Wet etching using etching solutions enabled to the materials to be removed may be carried out. Dry etching may also be carried out in order to remove the material, such as plasma etching or sputtering.

The etching operation or operations may furthermore be only chemical or electrochemical or photoelectrochemical, or a combination of these. The etching operation or operations may be preceded, followed, or accompanied by mechanical attack of the wafer 10, such as lapping, polishing, mechanical etching or sputtering of atomic species. If the etching operation or operations are accompanied by mechanical attack, preferably the mechanical attack comprises polishing, optionally combined with the action of mechanical abrasives in a CMP process. Alternatively, the portion of the wafer 10 that it is desired to remove may thus be entirely removed by just chemical means, or by chemical-mechanical means.

In one embodiment, the etching operation or operations are carried out to preserve on the wafer 10 only at least a portion of layer 2'. In another embodiment, the etching operation or operations are carried out to preserve on the wafer 10 a portion of the supporting substrate 1 and the layer 2'. This last embodiment makes it possible to maintain the high surface quality and the thickness uniformity of the strained layer 2 that were obtained during its crystal growth.

These techniques for material removal are proposed as examples in the present document, but other suitable techniques may be used.

A surface finishing technique is advantageously carried out on the active layer, such as optionally selective chemical etching, CMP polishing, a heat treatment or any other smoothing operation. In the case in which a portion of the supporting substrate 1 remains after the separation of part of the source wafer 10, and if it is desired not to retain this residual layer of the supporting substrate 1, it may be advantageous to carry out a finishing step comprising selective etching of the remaining portion of the supporting substrate 1 with respect to the layer 2'. In this case, a layer 2' may be obtained which is uniform in thickness and/or has a good surface finish, preventing a substantial number of defects from appearing, such as work-hardened regions, as is sometimes the case with mechanical finishing. It is then also possible to obtain a portion of the layer 2' which is uniform in thickness and/or has a good surface finish by carrying out selective etching on the layer 2'. Layer 2' can comprise a stop layer for the etching carried out. These last two finishing operations involving selective etching are particularly advantageous if it is desired in the end to obtain very thin layers 2'.

A product wafer, such as structure 20, can thus be obtained. As shown in FIG. 1*d*, structure 20 includes the receiving substrate 5, an active layer 6 and optionally an inserted bonding layer. As described above, one possibility is preserving only at least a portion of the relaxed strained layer 2' in the structure 20. In this case, the active layer 6 includes of at least the portion of the relaxed strained layer 2'.

Where a portion of the supporting substrate 1 and the relaxed strained layer 2' are preserved, the active layer 6 then includes the preserved portion of the supporting substrate 1 and the relaxed strained layer 2'. In this case, the remaining portion of the supporting substrate 1 may in turn be in a strained state by the subjacent relaxed strained layer 2'.

In one embodiment, one or more crystal growth operations may be carried out on the structure 20.

Once the final structure has been achieved, a finishing step may optionally be carried out, such as finishing treatments including an annealing operation in order to further strengthen the bonding interface between the useful layer 6 and the receiving substrate 5.

One or more epilayers may also be grown on the removed portion of wafer 10.

The following is a description of examples of materials that can constitute the structures in question by implementation of a process according to the invention will be given. Layers made of materials based on Si and SiGe can be used, for instance.

As explained above, SiGe containing 30% Ge has a nominal lattice parameter about 1% greater than that of Si. A strained layer 2 of SiGe having a predefined Ge concentration and formed on an Si supporting substrate 1 can be used for implementing a process according to the invention.

Preferred processes for forming useful layer according to the invention are presented in the following examples:

EXAMPLE 1

Referring to FIG. 1*a*, an embodiment of wafer 10 comprises a Si supporting substrate 1 and a strained layer 2 made of SiGe having a predefined Ge concentration, with a thickness less than a critical end-of-strain thickness (described above). The strained SiGe layer 2 has a typical Ge concentration of greater than 15%. The strained SiGe layer 2 advantageously has a density of defects, such as dislocations, of less than about $10^7$ cm$^{-2}$. The respective typical thicknesses of a strained layer 2 containing 15% Ge and of a strained layer 2 containing 30% Ge are around 250 nm and around 100 nm, thus remaining below their respective critical end-of-elastic-strain thicknesses.

Referring to FIG. 1*b*, a region of perturbation 3 is formed in the Si supporting substrate 1 by implantation of atomic species such as H or He. The ranges of H or He implant energies used are typically between 12 and 25 keV. The implanted H or He doses are typically between $10^{14}$ and $10^{17}$ cm$^{-2}$.

For example, for a strained layer 2 containing 15% Ge, it will be preferred to use H for the implant, with a dose of around $3\times10^{16}$ cm$^{-2}$ at an energy of around 25 keV. For example, for a strained layer 2 containing 30% Ge, it will be preferred to use He for the implant, with a dose of around $2.0 \times 10^{16}$ cm$^{-2}$ at an energy of around 18 keV. The implantation depths of the atomic species are typically between 50 nm and 100 nm.

The formation of the region of perturbation 3 is then followed by a suitable heat treatment, such as to displace perturbations in the transition layer 4 and cause dislocations in the relaxed strain layer 2' to disappear. The heat treatment is carried out in an inert atmosphere. However, the heat treatment may be carried out in another atmosphere such as, for example, an oxidizing atmosphere. A suitable heat treatment to be carried out for this type of wafer 10 is performed at temperatures typically between 600° C. and 1000° C. for a typical time ranging from about 5 minutes to about 15 minutes.

For more details regarding experimental techniques, reference is made to the studies carried out by B. Holländer et al, especially in the document entitled "*Strain relaxation of pseudomorphic $Si_{1-x}Ge_x/Si(100)$ heterostructures after hydrogen or helium ion implantation for virtual substrate fabrication*" (in Nuclear and Instruments and Methods in Physics Research B 175–177 (2001) 357–367).

In another embodiment of forming a region of perturbation 3 according to the present invention, hydrogen or helium is implanted with a dose of about $10^{17}$ cm$^{-2}$. This dose is suitable for forming a region of weakness using a process of the Smart-Cut® type and allows both a region of perturbation 3 and a region of weakness to be formed. This region of weakness will thus have two functions, namely of causing internal strains capable of forming crystalline perturbations in the overlying transition layer 4 and of being sufficiently weak to detach the wafer 10 in two portions after supplying energy. In one embodiment, a subsequent heat treatment will have the two functions of relaxing the strains in the strained layer 2 and of further weakening the region of weakness.

Whatever the particular method of implementation chosen to form the transition layer 4, the SiGe strained layer 2 relaxes, at least partly, in order to form an SiGe relaxed strained layer 2'.

Referring to FIG. 1*c*, the receiving substrate 5 attached to the wafer 10 may consist of any suitable material, such as silicon or quartz. An SiO$_2$ bonding layer is advantageously inserted between the relaxed strained layer 2' and the receiving substrate 5, thereby making it possible to produce (with reference to FIG. 1*d*) a structure 20 of the SGOI (SiGe on insulator) or Si/SGOI (Si on SiGe on insulator) type, the insulator in question in this structure 20 then being the SiO$_2$ layer.

Referring to FIG. 1*d*, one or more known techniques for removing material may be carried out. In particular, selective etching of the Si may be carried out using etching solutions having substantial selectivity with respect to SiGe, such as solutions comprising at least one of the following compounds: KOH, NH$_4$OH (ammonium hydroxide), TMAH, EDP or HNO$_3$ or solutions currently under study, that combine agents such as HNO$_3$, HNO$_2$, H$_2$O$_2$, HF, H$_2$SO$_4$, H$_2$SO$_2$, CH$_3$COOH and H$_2$O, as explained in U.S. Publication 2001/0003269 A1.

In one embodiment, the selective etching makes it possible to remove a remaining portion of the supporting substrate 1 and to retain the relaxed strained layer 2' on the structure 20. The useful layer 6 includes, after etching, the relaxed strained layer 2'.

In another embodiment, an Si etch stop layer is placed in the supporting substrate 1, making it possible to preserve, from selective chemical etching of the etch-back type, an Si layer overlying to the stop layer, the active layer 6 then comprising in this case the relaxed strained layer 2' and the Si layer overlying to the stop layer. The stop layer may for example be made of SiGe and the selective chemical etching in question employs one of the above etching solutions.

Referring to FIG. 1*d*, a structure 20 comprising the receiving substrate 5 and an active layer 6 is obtained. The active layer 6 comprises at least one portion of the SiGe relaxed strained layer 2' and optionally an Si layer, remaining portion of the supporting substrate 1, depending on the method of removal employed.

EXAMPLE 2

Figure 2:
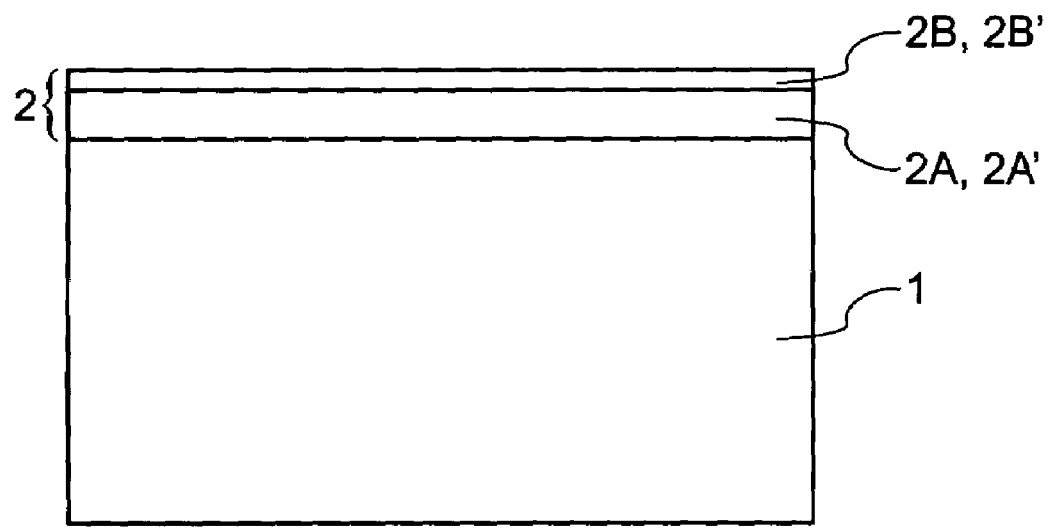
FIG. 2 shows an embodiment of a wafer constructed according to the invention from which a useful layer will be transferred.

Referring to FIG. 2, this example relates to a wafer 10 similar to that of Example 1, but furthermore including a substantially relaxed Si layer on the strained SiGe layer. The strained layer 2 includes the strained SiGe layer 2A and the relaxed Si layer 2B.

This strained layer 2 has a thickness of less than the critical thickness of the SiGe in question—above this thickness the SiGe relaxes. The strained layer 2A has substantially the same characteristics as the strained SiGe layer 2 of Example 1. The relaxed Si layer 2B has a thickness very much less than that of the thickness of the entire strained layer 2, so that the strained layer 2 retains an overall strained structural property. The relaxed Si layer 2B has a thickness of about a few tens of nanometres.

The implementation of the removal process is then substantially the same as that of Example 1.

The creation of a transition layer 4 and an additional advantageous heat treatment, that are substantially identical to those of Example 1, have the effect of:

(a) elastically relaxing the strained layer 2A in order to form a relaxed strained layer 2A' (not shown), and (b) elastically straining the relaxed layer 2B in order to form a strained relaxed layer that has a lattice parameter close to that of the subjacent relaxed SiGe.

After the wafer 10 has been bonded to a receiving substrate 5 at the relaxed strained layer 2B', with or without an intermediate bonding layer, material may be removed using one or more of the known techniques described above.

In a first method of implementing the material removal, it is desired to retain at least a portion of the relaxed strained layer 2A', and the strained Si layer 2B', and the material removal is then substantially the same as that described in Example 1. What is obtained in the end is a structure 20 as shown in FIG. 1*d*, which comprises the receiving substrate 5 and an active layer 6. The active layer 6 includes the strained Si layer 2B' and of at least one portion of the relaxed SiGe layer 2A' (and optionally an Si layer, or the remaining portion of the supporting substrate 1, depending on the removal method employed).

In a second method of implementing the removal process, it is desired to retain only at least a portion of the strained Si layer 2B'. The material removal is then substantially the same as described in Example 1, with an additional step of removing the relaxed SiGe layer 2A'. For this purpose, selective etching of the SiGe may be carried out using solutions for the selective etching of SiGe with respect to Si, such as a solution comprising HF:H$_2$O$_2$:CH$_3$COOH (selectivity of about 1:1000). In this second method of implementing the process, the relaxed SiGe layer 2A' thus becomes sacrificial.

Such a sacrifice of the relaxed SiGe layer 2A' involves the disappearance of structural defects, such as dislocations with parameter difference strains, which may be confined on the surface and appear, before bonding, in the vicinity of the interface with the transition layer 4 after propagation of the perturbations in the transition layer 4. The relaxed SiGe layer 2A' thus preserves the strained Si layer 2B' from the possible structural defects resulting from the particular method of relaxation employed in the process according to the invention. This sacrificial technique is therefore particularly suited for obtaining in the end a strained Si layer 2B' with few structural defects.

What is obtained in the end is a structure 20 (like that shown in FIG. 1d) comprising the receiving substrate 5 and an active layer 6, the active layer 6 consisting of the strained Si layer 2B'.

EXAMPLE 3

Figure 3:
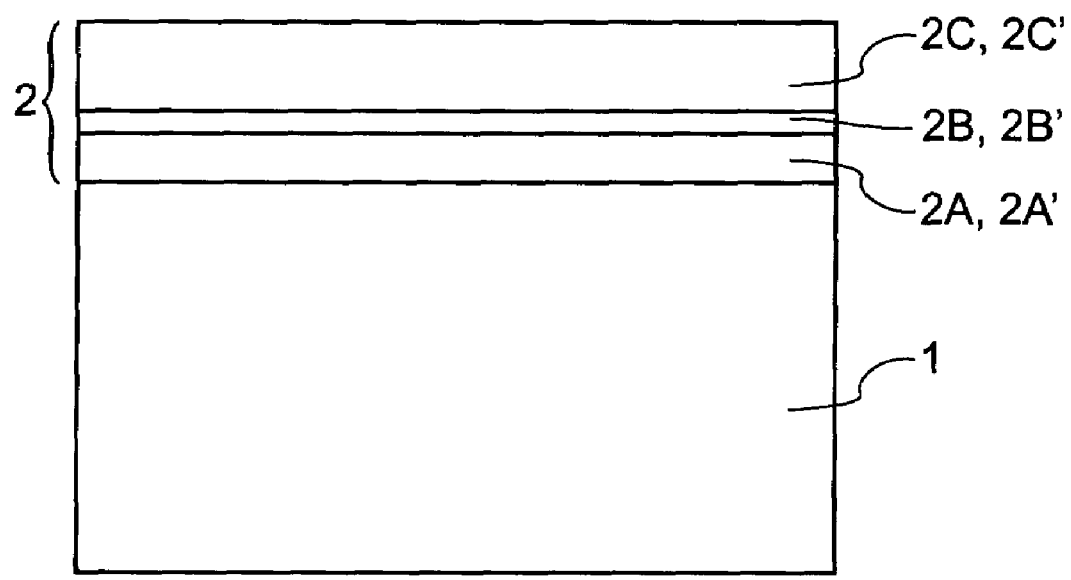
FIG. 3 shows another wafer embodiment from which a useful layer will be transferred.

With reference to FIG. 3, this example relates to a wafer 10 substantially the same as that of Example 2, further including a substantially strained SiGe layer on the relaxed Si layer. The strained layer 2 includes a strained SiGe layer 2A, a relaxed Si layer 2B, and a strained SiGe layer 2C. This strained layer 2 has a smaller thickness than the critical thickness of the SiGe in question, above which the SiGe relaxes. The strained layer 2A has substantially the same characteristics as the strained SiGe layer 2 of Example 1.

It will be advantageous to choose a thickness of the layer 2A greater than or equal to the typical thickness at which structural defects appearing near the interface with the transition layer 4, after propagation of the perturbations in the transition layer 4, are likely to be confined therein. Such a strained SiGe layer 2A will thus preserve the relaxed Si layer 2B and the strained SiGe layer 2C from any structural defects during overall relaxation of the strained layer 2.

The sacrificial technique in this example is particularly suitable for obtaining in the end an Si layer 2B with few structural defects. The relaxed Si layer 2B has a thickness far less than the thickness of the entire strained layer 2, so that the strained layer 2 retains an overall strained structural property. The relaxed Si layer 2B has a thickness of around a few tens of nanometres.

The strained SiGe layer 2C has substantially the same characteristics as the strained SiGe layer 2A. However, the strained SiGe layer 2C is advantageously thicker than the strained SiGe layer 2A. The strained SiGe layer 2C represents, in one particular situation, the major portion of the thickness of the strained layer 2.

The implementation of the removal process is then substantially identical to that of Example 2.

The creation of a transition layer 4 and an additional advantageous heat treatment, which are identical to those of Example 1, have the effect of:

(a) elastically relaxing the strained layer 2A in order to form a relaxed strained layer 2A';

(b) elastically straining the relaxed layer 2B in order to form a strained relaxed layer 2B', the latter then having a lattice parameter close to that of the subjacent relaxed SiGe; and (c) elastically relaxing the strained layer 2C in order to form a relaxed strained layer 2C'.

After the wafer 10 has been bonded to a receiving substrate 5 at the relaxed strained layer 2C', with or without an intermediate bonding layer, material may be removed using one or more of the known techniques described above.

In a first method of implementing the material removal, it is desired to retain at least a portion of the relaxed strained layer 2A', the strained Si layer 2B' and the relaxed SiGe layer 2C', and the material removal is then substantially the same as that described in Example 1. What is obtained in the end is a structure 20 (like that shown in FIG. 1d) comprising the receiving substrate 5 and an active layer 6, the active layer 6 consisting of the relaxed SiGe layer 2C', the strained Si layer 2B' and of at least one portion of the relaxed SiGe layer 2A' (and optionally of an Si layer, or the remaining portion of the supporting substrate 1, depending on the removal method employed).

In a second method of implementing the material removal, it is desired to preserve only at least a portion of the strained Si layer 2B' and the relaxed SiGe layer 2C', the material removal then being substantially identical to the second method of implementing the material removal of Example 2. What is obtained in the end is a structure 20 (like that shown in FIG. 1d) comprising the receiving substrate 5 and an active layer 6, the active layer 6 consisting of at least the portion of the strained Si layer 2B' and of the relaxed SiGe layer 2C'.

In a third method of implementing the process, it is desired to retain only at least a portion of the relaxed SiGe layer 2C', and the material removal is then substantially the same as that described in the second method of implementation above, with furthermore an additional step of removing the strained Si layer 2B'. For this purpose, selective etching of the strained Si 2B' may be carried out using solutions comprising at least one of the following compounds: KOH, $NH_4OH$ (ammonium hydroxide), TMAH, EDP or $HNO_3$ or solutions currently under study that combine agents such as $HNO_3$, $HNO_2$, $H_2O_2$, HF, $H_2SO_4$, $H_2SO_2$, $CH_3COOH$ and $H_2O$. Since the relaxed SiGe layer 2C' is an etching stop layer, this method makes it possible in the end to obtain a layer particularly uniform in thickness with a low surface roughness. Thus, it is possible in particular to have a layer of very small thickness while maintaining good layer quality. What is obtained in the end is a structure 20 (like that shown in FIG. 1d) comprising the receiving substrate 5 and an active layer 6, the active layer 6 constituting the relaxed SiGe layer 2C'.

In an embodiment of a method of using the structure 20, and whatever the structure 20 obtained, one or more epilayers may be grown on the wafer 10, such as the epitaxial growth of an SiGe layer or of a strained Si layer, or other epilayers consisting of an alternating succession of SiGe layers or strained Si layers in order to form a multilayer structure.

In the semiconductor layers of various embodiments, other constituents may be added thereto, such as carbon with a carbon concentration in the layer in question substantially less than or equal to 50% or more particularly with a concentration of less than or equal to 5%. In addition to a strained SiGe layer 2 and an Si supporting substrate 1, other materials may alternatively be used, such as materials of the III–V or II–VI atomic family (of the binary, ternary or quaternary type or having a higher degree), that can be employed using a process according to the present invention. For example, different embodiments use gallium arsenide, indium phosphide, gallium nitride. Structures obtained after splitting the composite wafer structure 8, shown in FIG. 1c, may be SGOI, SOI (Si on insulator) or Si/SGOI, or may be of other wafer types.

While illustrative embodiments of the invention are disclosed herein, it will be appreciated that numerous modifications and other embodiments may be devised by those skilled in the art. For example, in some embodiments, dislocation caused by the perturbation layer may extend all the way to the free surface of the relaxed strained layer, but not in other embodiments in which the perturbations merely cause the lattice parameter to change in a direction towards the strained layer. Therefore, it will be understood that the appended claims are intended to cover all such modifications and embodiments that come within the spirit and scope of the present invention.

What is claimed is:

1. A method of preparing crystalline wafer, comprising:
   providing a first composite structure comprising a support substrate and a first epitaxial layer that is in a strained state and is associated with one side of the support substrate;
   relaxing the strained state of the first epitaxial layer of the composite structure to an at least partially relaxed state;
   creating a region of weakness substantially between the first epitaxial layer and the support substrate;
   associating a receiving substrate with the first composite structure with the side of the support that includes the first epitaxial layer; and
   obtaining a production wafer and a donor wafer by splitting the first composite structure at a region of weakness located therein.

2. The method of claim 1, wherein the strained state of the first epitaxial layer is relaxed by providing dislocations in a dislocation layer between the first epitaxial layer and the support substrate in a configuration sufficient to relax the first epitaxial layer to a substantially relaxed state, prior to associating the receiving substrate with the structure by bonding to the relaxed first epitaxial layer.

3. The method of claim 1 wherein the region of weakness is created by implanting atomic species between the first epitaxial layer and the support substrate.

4. A method of preparing crystalline wafer, comprising:
   providing a first composite structure comprising a support substrate and a first epitaxial layer that is in a strained state and is associated with one side of the support substrate;
   relaxing the strained state of the first epitaxial layer of the composite structure to an at least partially relaxed state by providing dislocations in a dislocation layer between the first epitaxial layer and the support substrate in a configuration sufficient to relax the first epitaxial layer;
   creating a region of weakness substantially between the first epitaxial layer and the support substrate by implanting atomic species between the first epitaxial layer and the support substrate;
   associating a receiving substrate with the first composite structure with the side of the support that includes the first epitaxial layer; and
   obtaining a production wafer and a donor wafer by splitting the first composite structure at a region of weakness located therein;
   wherein the strained state of the first epitaxial layer is relaxed prior to associating the receiving substrate with the structure by bonding to the relaxed first epitaxial layer; and the implantation of the atomic species both creates the region of weakness and provides dislocations between the first epitaxial layer and the support substrate for relaxing the strained state of the epitaxial layer.

5. The method of claim 1, further comprising providing an additional layer on the relaxed first epitaxial layer prior to associating the receiving substrate with the first composite structure, wherein the receiving substrate is bonded to the additional layer.

6. The method of claim 5, wherein the crystalline wafer is a semiconductor wafer, and the additional layer is a strained silicon layer.

7. The method of claim 1, further comprising providing an additional layer between the first epitaxial layer and the support substrate prior to associating the receiving substrate with the first composite structure, wherein the receiving substrate is bonded to the relaxed first epitaxial layer.

8. The method of claim 1, further comprising removing a layer of the production wafer disposed on an opposite side of the first epitaxial layer from the receiving substrate to provide an exposed surface.

9. The method of claim 8, further comprising providing another layer on the exposed surface of the production wafer.

10. The method of claim 9, wherein said another layer is grown on the exposed surface.

11. The method of claim 1, wherein the support substrate comprises silicon.

12. The method of claim 11, wherein the first epitaxial layer comprises silicon germanium.

13. The method of claim 1, wherein the first epitaxial layer is relaxed sufficiently to reduce the strain thereof to less than 75% of the strain than in the strained state.

14. The method of claim 1, wherein energy is added to the first composite structure to relax the first epitaxial layer.

15. The method of claim 1, wherein the first epitaxial layer is grown in the strained state on the support substrate.

* * * * *